(12) United States Patent
Schumacher

(10) Patent No.: US 8,185,850 B1
(45) Date of Patent: May 22, 2012

(54) METHOD OF IMPLEMENTING A CIRCUIT DESIGN USING CONTROL AND DATA PATH INFORMATION

(75) Inventor: Paul R. Schumacher, Berthoud, CO (US)

(73) Assignee: Xilinx, Inc., San Jose, CA (US)

( * ) Notice: Subject to any disclaimer, the term of this patent is extended or adjusted under 35 U.S.C. 154(b) by 177 days.

(21) Appl. No.: 12/730,183

(22) Filed: Mar. 23, 2010

(51) Int. Cl.
*G06F 9/45* (2006.01)
*G06F 17/50* (2006.01)
*G06F 9/455* (2006.01)

(52) U.S. Cl. ........................ 716/103; 716/132

(58) Field of Classification Search .................. 716/103, 716/132
See application file for complete search history.

(56) References Cited

U.S. PATENT DOCUMENTS

| | | | |
|---|---|---|---|
| 5,594,657 A * | 1/1997 | Cantone et al. ............... | 716/104 |
| 6,735,743 B1 * | 5/2004 | McElvain ...................... | 716/103 |
| 7,478,028 B2 * | 1/2009 | Ho et al. ......................... | 703/14 |
| 2002/0004927 A1 * | 1/2002 | Takahashi et al. ............... | 716/2 |
| 2002/0059553 A1 * | 5/2002 | Eng ................................. | 716/4 |
| 2005/0204316 A1 * | 9/2005 | Nebel et al. ..................... | 716/2 |
| 2006/0112356 A1 * | 5/2006 | McGaughy et al. ............. | 716/3 |
| 2006/0117274 A1 * | 6/2006 | Tseng et al. ..................... | 716/1 |
| 2008/0015838 A1 * | 1/2008 | Stern ............................... | 703/15 |

OTHER PUBLICATIONS

U.S. Appl. No. 12/041,167, Schumacher, Paul R., et al., filed Mar. 3, 2008, Xilinx, Inc. 2100 Logic Drive, San Jose, CA 95124 USA.
U.S. Appl. No. 12/041,182, Schumacher, Paul R., et al., filed Mar. 3, 2008, Xilinx, Inc. 2100 Logic Drive, San Jose, CA 95124 USA.
Landman, P.E. and Rabaey, J.M., "Architectural Power Analysis: The Dual Bit Type Method", IEEE Transactions on Very Large Scale Integration (VLSI) Systems, vol. 3, No. 2, Jun. 1995, 173-187 pp.
Smith, A.M. et al., "Fused-Arithmetic Unit Generation for Reconfigurable Devices using Common Subgraph Extraction", 2007 IEEE, FPT 2007, 1-8 pp, Dec. 12-14, 2007.
Yu, C.W. et al., "Optimizing Coarse-Grained Units in Floating Point Hybrid FPGA", 57-64 pp., FPT 2008, Dec. 8-10, 2008.
Xilinx, UG695 (v 11.2), "ISE in Depth Tutorial", Jun. 24, 2009, 150 pp., Xilinx, Inc., 2100 Logic Drive, San Jose, CA 95124 USA.

* cited by examiner

*Primary Examiner* — Suresh Memula
(74) *Attorney, Agent, or Firm* — John J. King

(57) ABSTRACT

A method of implementing a circuit design is described. The method comprises specifying criteria for control and data path identification; generating a representation for the circuit design; analyzing the representation based upon the criteria for control and data path identification; identifying control and data elements of the circuit design based upon paths and macros of the circuit design; and generating a modified representation, by a computer, for the circuit design based upon the identified control and data elements.

15 Claims, 11 Drawing Sheets

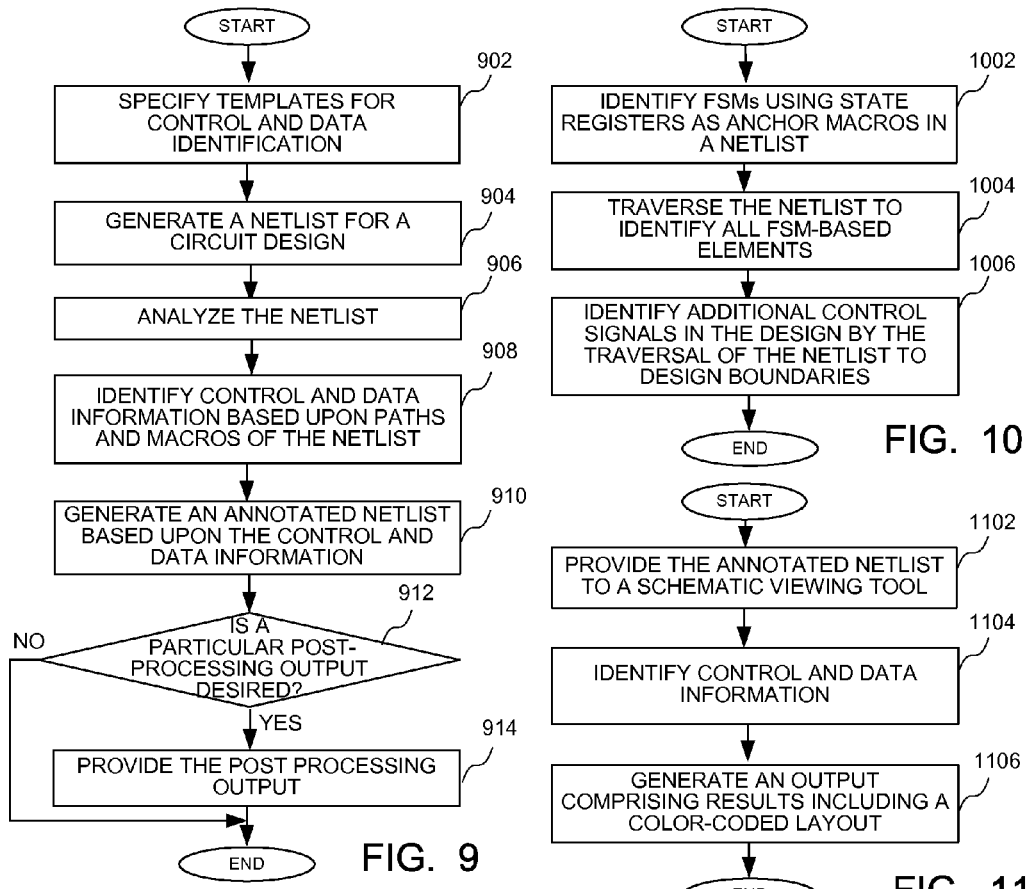
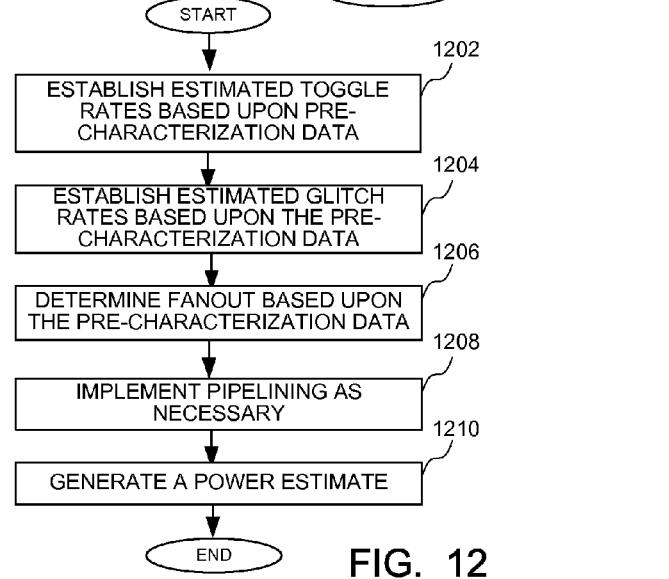

METHOD OF IMPLEMENTING A CIRCUIT DESIGN USING CONTROL AND DATA PATH INFORMATION

FIELD OF THE INVENTION

The present invention relates generally to integrated circuits, and in particular, to a method of implementing a circuit design for an integrated circuit using control and data path information.

BACKGROUND OF THE INVENTION

Integrated circuits are an integral part of any electronic device. A variety of integrated circuits may be used together to enable the operation of an electronic device. While integrated circuits are typically designed for a particular application, one type of integrated circuit which enables flexibility is a programmable logic device (PLD). As will be described in more detail, a programmable logic device is designed to be user-programmable so that users may implement logic designs of their choices. Application specific integrated circuits (ASICs) may also comprise programmable portions which enable the ASIC to function as a PLD. That is, in addition to a fixed hardware design, a programmable logic portion may comprise programmable circuits.

However, as hardware systems have become more complex, capturing their descriptions in a synthesizable language has become a very complex task. Recent efforts to alleviate some of the complexity for designers have resulted in the evolution of computer languages into high-level languages (HLLs). Examples of such HLLs include but are not limited to the C language and all its variants, SystemVerilog, and dataflow languages such as CAL. These HLLs typically allow for complex systems to be described in significantly fewer lines of code, thus allowing the design cycle to be compressed and the time-to-market for the design to be reduced.

However, one drawback to the use of high level languages is the limited correlation between the source code entered by the user and the hardware that is produced. This limited feedback makes it difficult for users of HLL tools to optimize their designs. How a design maps to a specific hardware platform can sometimes only be fully understood by an expert with considerable insight. Further, insight into the types of data processing that is performed, the corresponding logic that controls the data paths and the communication between these block can require in-depth insight into the specific contents of the design.

SUMMARY OF THE INVENTION

A method of implementing a circuit design using control and data path information is described. The method comprises specifying criteria for control and data path identification; generating a representation for the circuit design; analyzing the representation based upon the criteria for control and data path identification; identifying control and data elements of the circuit design based upon paths and macros of the circuit design; and generating, by a computer, a modified representation for the circuit design based upon the identified control and data elements.

According to an alternate embodiment, a method of implementing a circuit design comprises specifying criteria for control and data path identification; generating a representation for the circuit design; analyzing the representation based upon the criteria for control and data path identification; identifying finite state machines using state registers as anchor macros in the representation; traversing elements associated with the finite state machines; and generating, by a computer, a modified representation for the circuit design based upon the elements associated with the finite state machines.

According to yet another embodiment, a non-transitory computer-readable storage medium comprises computer-executable code for implementing a circuit design, where the computer-executable code comprises: code for specifying criteria for control and data path identification; code for generating a representation for the circuit design; code for analyzing the representation based upon the criteria for control and data path identification; code for identifying control and data elements of the circuit design based upon paths and macros of the circuit design; and code for generating a modified representation for the circuit design based upon the identified control and data elements.

BRIEF DESCRIPTION OF THE DRAWINGS

FIG. 9 is a flow chart showing a method of implementing of a circuit design using control and identification path information according to an embodiment of the present invention;

FIG. 10 is a flow chart showing a method of implementing a circuit design using control and data path information by identifying finite state machines according to an embodiment of the present invention;

FIG. 11 is a flow chart showing a method of implementing a circuit design using control and data path information by providing post-processing related to control and data information according to an embodiment of the present invention;

FIG. 12 is a flow chart showing a method of generating a power estimate based upon control and data information according to an embodiment of the present invention;

DETAILED DESCRIPTION OF THE DRAWINGS

Figure 1:
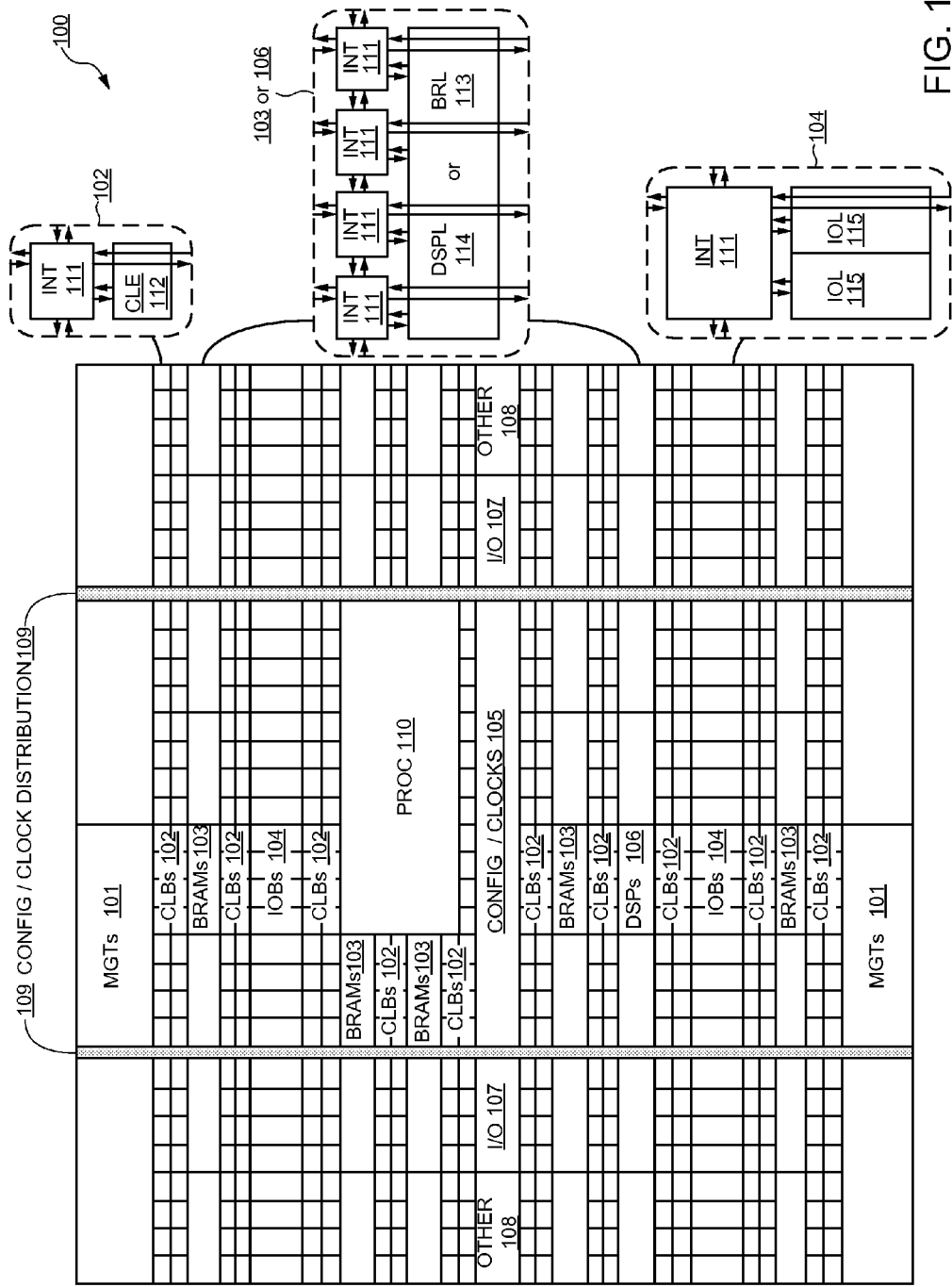
FIG. 1 is a block diagram of a device having programmable resources according to an embodiment of the present invention.

Turning first to FIG. 1, a block diagram of an integrated circuit device having programmable resources according to an embodiment the present invention is shown. While devices having programmable resources may be implemented in any type of integrated circuit device, such as an application specific integrated circuit (ASIC) having programmable resources, other devices comprise dedicated programmable logic devices. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 1 comprises an FPGA architecture 100 having a large number of different programmable tiles including multi-gigabit transceivers (MGTs) 101, CLBs 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110, which may be used to implement a software application, for example.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 may include a configurable logic element (CLE) 112 that may be programmed to implement user logic plus a single programmable interconnect element 111. A BRAM 103 may include a BRAM logic element (BRL) 113 in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element (DSPL) 114 in addition to an appropriate number of programmable interconnect elements. An IOB 104 may include, for example, two instances of an input/output logic element (IOL) 115 in addition to one instance of the programmable interconnect element 111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a horizontal area near the center of the die is used for configuration, clock, and other control logic. Vertical areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several rows of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2:
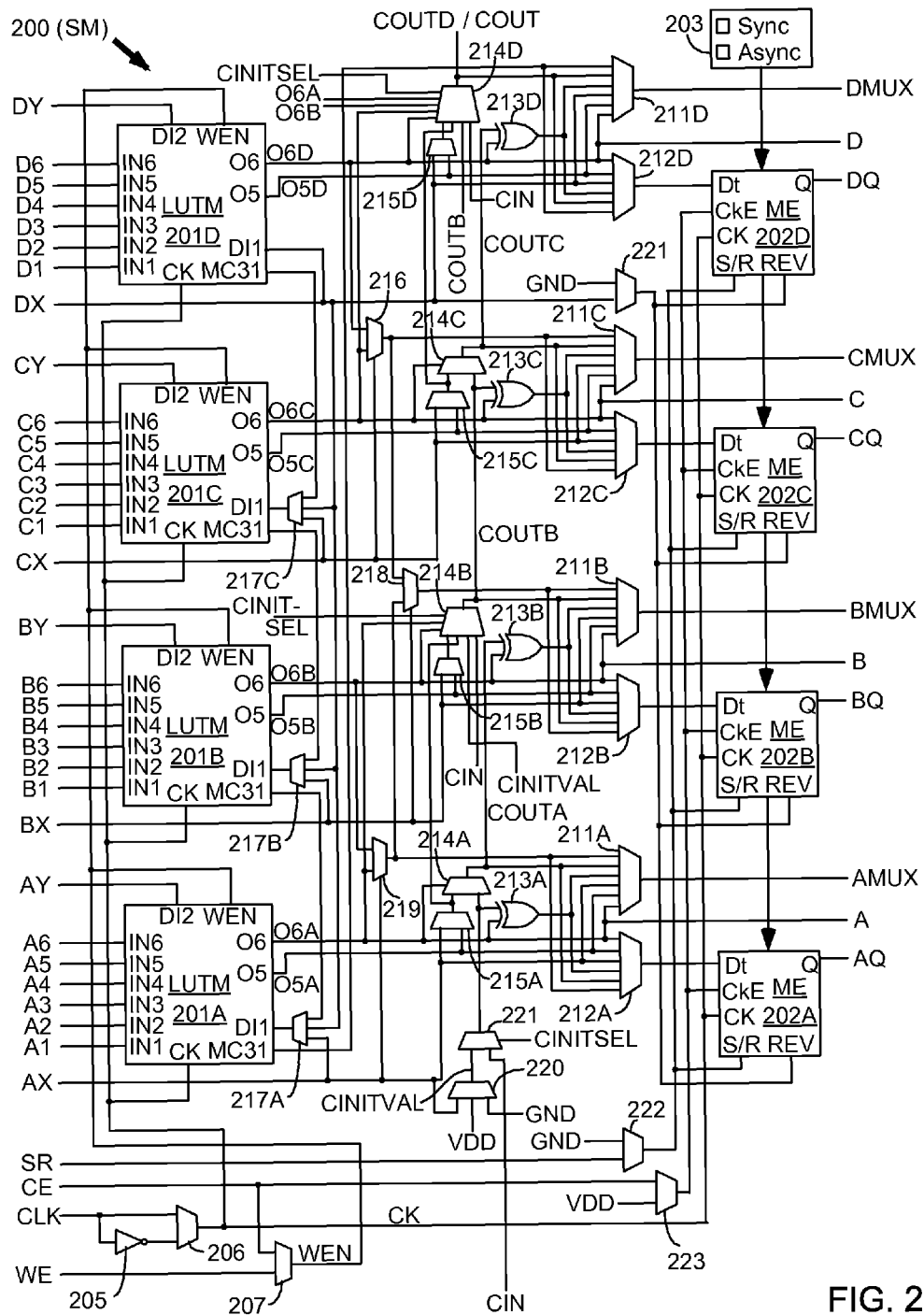
FIG. 2 is a block diagram of a configurable logic element of the device of FIG. 1 according to an embodiment of the present invention.

Turning now to FIG. 2, a block diagram of a configurable logic element of the device of FIG. 1 according to an embodiment of the present invention is shown. In particular, FIG. 2 illustrates in simplified form a configurable logic element of a configuration logic block 102 of FIG. 1. In the embodiment of FIG. 2, slice M 200 includes four lookup tables (LUTMs) 201A-201D, each driven by six LUT data input terminals A1-A6, B1-B6, C1-C6, and D1-D6 and each providing two LUT output signals O5 and O6. The O6 output terminals from LUTs 201A-201D drive slice output terminals A-D, respectively. The LUT data input signals are supplied by the FPGA interconnect structure via input multiplexers, which may be implemented by programmable interconnect element 211, and the LUT output signals are also supplied to the interconnect structure. Slice M also includes: output select multiplexers 211A-211D driving output terminals AMUX-DMUX; multiplexers 212A-212D driving the data input terminals of memory elements 202A-202D; combinational multiplexers 216, 218, and 219; bounce multiplexer circuits 222-223; a circuit represented by inverter 205 and multiplexer 26 (which together provide an optional inversion on the input clock path); and carry logic comprising multiplexers 214A-214D, 215A-215D, 220-221 and exclusive OR gates 213A-213D. All of these elements are coupled together as shown in FIG. 2. Where select inputs are not shown for the multiplexers illustrated in FIG. 2, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 2 for clarity, as well as from other selected figures herein.

In the pictured embodiment, each memory element 202A-202D may be programmed to function as a synchronous or asynchronous flip-flop or latch. The selection between synchronous and asynchronous functionality is made for all four memory elements in a slice by programming Sync/Asynch selection circuit 203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 202A-202D are clocked by a clock signal CK, which may be provided by a global clock network or by the interconnect structure, for example. Such programmable memory elements are well known in the art of FPGA design. Each memory element 202A-202D provides a registered output signal AQ-DQ to the interconnect structure. Because each LUT 201A-201D provides two output signals, O5 and O6, the LUT may be configured to function as two 5-input LUTs with five shared input signals (IN1-IN5), or as one 6-input LUT having input signals IN1-IN6.

In the embodiment of FIG. 2, each LUTM 201A-201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 217A-217C for LUTs 201A-201C), or to the two 32-bit RAMs via input terminals DI1 and DI2. RAM write operations in the LUT RAMs are controlled by clock signal CK from multiplexer 206 and by write enable signal WEN from multiplexer 207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 201A may also be provided to the general interconnect structure for shift register chaining, via output select multiplexer 211D and CLE output terminal DMUX. The devices having programmable resources and methods of the present invention may be implemented according to the device of FIGS. 1 and 2, or in any device, including any type of integrated circuit, having programmable resources used to implement at least a portion of a circuit design.

Figure 3:
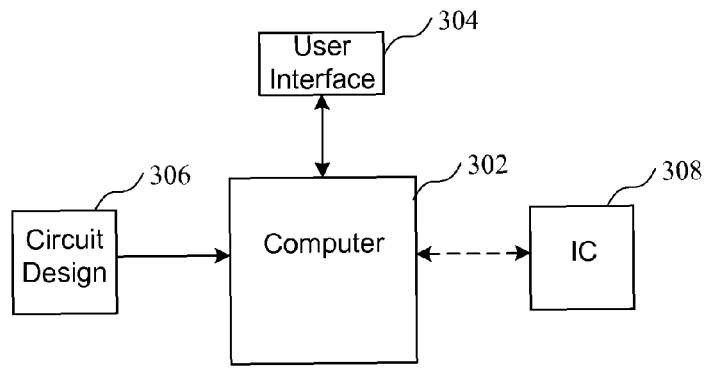
FIG. 3 is a block diagram of a system for implementing a circuit design using control and data path information according to an embodiment of the present invention.

Turning now to FIG. 3, a block diagram of a system for implementing a circuit design using control and data path information according to an embodiment of the present invention is shown. In particular, a computer 302 is coupled to a user interface 304 and receives a design circuit 306. As will be described in more detail below, the computer 302 enables the implementation of a circuit design in an integrated circuit. The computer may also interface with an integrated circuit 308 to implement the circuit design in the integrated circuit.

The software flow for implementing a circuit design in a device having programmable resources includes synthesis, packing, placement, and routing. Synthesis comprises converting a circuit design in a high-level design to a configuration of the elements found in the device which is to receive the circuit design. For example, a synthesis tool operated by the computer 302 may implement portions of a circuit design enabling certain functions in CLBs or DSP blocks, as will be described in more detail below. The methods of the present invention enable a synthesis process which benefits from control and data path identification. Packing comprises grouping portions of the circuit design into defined blocks, such as CLBs, of a device. Placing comprises determining the location of the blocks of the device to receive the circuits defined during packing, wherein the blocks in a design may be placed on the two-dimensional grid associated with specific elements of the device. Placement is performed by a placer, which may include placement software running on a computer, or a portion of a larger software package running on a computer for implementing a circuit design in a device. Finally, routing comprises selecting paths of interconnect elements, such as programmable interconnects in a device having programmable elements.

An example of a synthesis tool which may implement conventional methods of synthesis, packing, placement and routing is the ISE tool available from Xilinx, Inc. of San Jose Calif. Because these steps, and more particularly placement and routing, are often time consuming and require engineering and computer resources, generating estimates and providing control and data path information based upon elements of a netlist during synthesis may be particularly advantageous to a user. That is, a user may evaluate the resource estimates and control and data path information and modify a design to improve resource requirements or performance.

Figure 4:
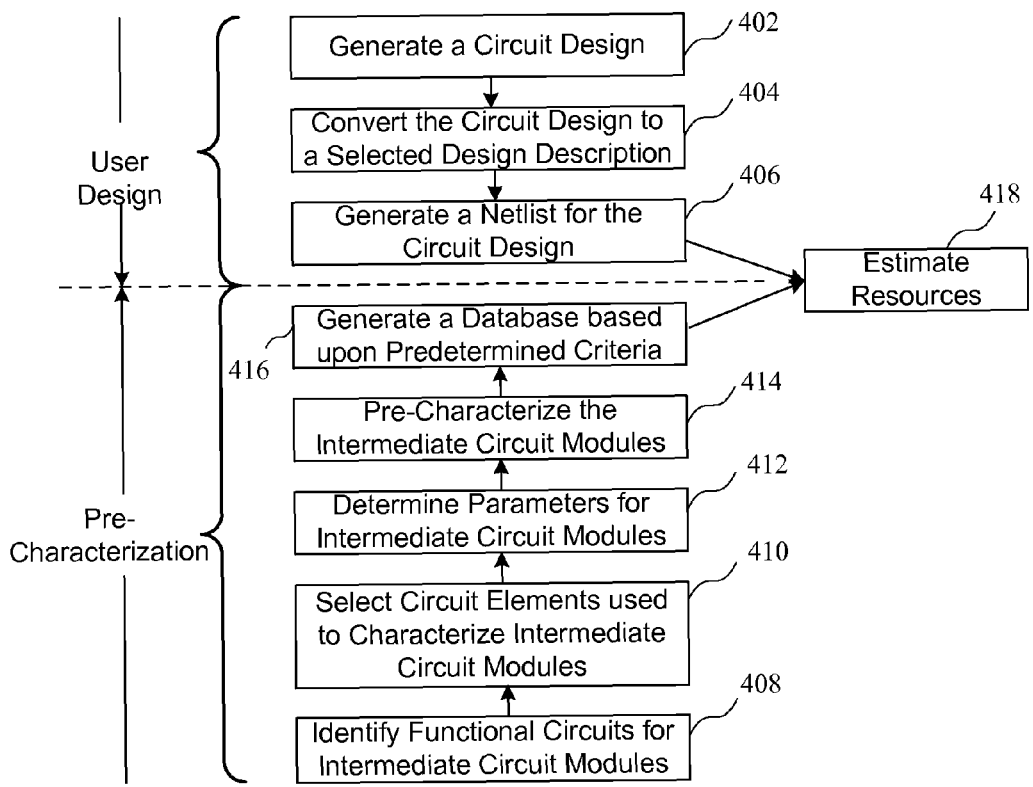
FIG. 4 is a flow diagram showing the generation of data to be used by an estimation tool according to an embodiment of the present invention.

Before discussing the use of control and data information according to one aspect of the invention, resource estimation will be described. Resource estimates may be used in conjunction with control and data information to improve the implementation of a circuit design. The flow diagram of FIG. 4 shows the generation of a resource estimate based upon circuit elements of a netlist. By pre-characterizing circuit elements which will be found in netlists for circuit designs, the methods of the present invention enable estimating and relaying back to the user, early in the design process, information about the implementation of a hardware system, such as resources of a programmable logic device required for implementing a circuit design, and performance characteristics of the circuit design during execution, such as latency, throughput, area, and power estimates.

According to one aspect of the invention, a netlist generated for a particular user design is analyzed according to pre-characterization data based upon circuit elements of netlists. In particular, after a circuit design is generated as shown in block 402, the circuit design is converted to a selected design description as shown in block 404. By way of example, after a schematic of a circuit design is generated, a high level design description, such as a high level language (HLL) or a register transfer language (RTL) representation, may be provided for the circuit design. A netlist is then generated for the circuit design as shown in the block 406. While a selected design description is given by way of example as an HLL or RTL representation, it is important to note that the methods of the present invention enable generating an estimate of a circuit design based upon a netlist regardless of how the circuit design is converted to a netlist. For example, a netlist may be generated directly from the circuit design, or some other representation of the circuit design other than an HLL or RTL representation. However, whether an HLL or RTL representation of a circuit design is used to generate a netlist may affect the resources in which the circuit elements are implemented, where an RTL representation of the circuit design may provide limited choices in how the circuit design is implemented.

Before any given circuit design is analyzed, it is necessary to pre-characterize circuit elements which may commonly be found in any netlist. A netlist is a representation of a circuit design found after tasks commonly referred to as parsing, which comprises dividing the code to be implemented into sections, and elaborating, where the parsed sections of code are converted to a netlist, are performed. The circuit elements defined in a netlist are independent of the higher level representation used to generate the netlist, and the netlist is typically independent of the hardware platform that is eventually targeted. In some cases, some netlists may be generated with circuit elements such as intellectual property (IP) cores which are specific to a targeted hardware platform, as will be described in more detail below. A netlist contains information regarding content as well as structural information and connectivity for a circuit design. More particularly, a net of a netlist represents a collection of interconnect lines from the output of a user logic block to inputs of the next destination block, while a path represents a sequence of nets between registers comprising a connection from a source to a specific destination. A path may be defined as a clock to clock path, such as one register to another register, a register to an output, an input to a register, or an input to an output, as is well known in the art. Accordingly, the methods of the present invention involve creating a mid-level view of a circuit design, by describing it in terms of a library of well-known, highly-parameterizable circuit elements of a netlist. The circuit elements of the netlist are preferably at a level which enables generating an estimate in terms of elements of a targeted device easier. As will be described in more detail below, these circuit elements are pre-characterized for a given target device and according to predetermined input parameters.

A netlist may also contain IP cores. An IP core is a larger, pre-defined function and enables a user to complete a large design faster. That is, an IP core comprises a plurality of circuit elements normally found in a netlist. Examples of IP cores may be a finite impulse response (FIR) filter or a fast fourier transform (FFT) circuit, each of which may comprise a large number of circuit elements found in a netlist. That is, when a circuit designer needs the functionality of a FIR circuit or an FFT circuit, it is possible to select an IP core for those circuits which are predefined and ready to implement. As will be described in more detail below, the resource estimate of an IP core alone may also be determined according to methods of the present invention. In order to perform the pre-characterization of elements in the netlist, intermediate circuit modules, also called macros of the netlist, comprising circuit elements defined in a netlist are identified as shown in block 408. Intermediate circuit modules may include a single element of a netlist. By way of example, the intermediate circuit modules may include an adder/subtractor, a twos-comparator, a multiplier, logical operators such as a conditional AND/OR operators, a bitwise AND/OR/XOR or a reduction-OR, logical shifters, multiplexers, counters, memories, or registers of a netlist.

In either case, the intermediate circuit modules are characterized in terms of circuit elements selected to characterize the intermediate circuit modules in block 410. For example, the intermediate circuit modules may be characterized in terms of resources commonly found in certain families of PLDs, such as LUTs, BRAMS, DSPs, or any other element described in FIGS. 1-2. The resources used to characterize the intermediate circuit modules may be a superset of all elements of a variety of devices, including elements which are not necessarily common between different families of devices. However, the characterization may include information related to the circuit elements of the netlist. As will be described in more detail below, other static and dynamic characteristics of the intermediate circuit modules may be generated. Accordingly, it may be possible to both determine whether a circuit design may be implemented in a given device, but also to benchmark a number of implementations of a circuit according to both resource and performance criteria.

Parameters, which are inputs to an intermediate circuit module or otherwise characterize the intermediate circuit module, must be determined as shown in block 412. Examples of parameters include a device family (or device within a family of devices), tool settings, number of inputs, bit widths of inputs and outputs, number of significant bits, and depths of memories. The device family enables an estimate to be generated by picking the resource requirements of the intermediate circuit modules found in the netlist that are generated for a given family. By way of example, a Virtex-4 FPGA device from Xilinx, Inc. of San Jose, Calif. has 4-input LUTs, while a Virtex-5 FPGA device has 6-input LUTs. As should be apparent, the requirements for LUTs of a given intermediate circuit module may be different based which family of device is chosen. Also, within a given family, the amount and/or configuration of memory and the variations of hard IP available on the chip may vary for different devices, leading to different resource estimates. As will be described in more detail below, numerous intermediate circuit modules will be defined in terms of the circuit elements of the netlist, and predetermined parameters defining the intermediate circuit module. That is, for a given circuit element of a netlist, a plurality of intermediate circuit modules are pre-characterized according to a plurality of parameter sets as shown in block 414. Finally, a database providing resource estimates of the intermediate circuit modules is generated as shown in block 416.

Finally, an estimate of resources is then generated for a circuit design as shown in block 418. In order to generate an estimate, both a netlist for which an estimate is to be generated and pre-characterization data are input to a resource estimation tool. The resource requirements and performance characteristics of the entire circuit design are then estimated based on the circuit elements identified in the netlist of the circuit design. Some design-level estimation techniques may also be used. For example, optimizations such as constant propagation and strength reduction may be performed either prior to or during the resource estimation. A back-end synthesis tool, which performs placement and routing according to user-selectable tool settings, may affect the final amount of resources required by the circuit design. The estimated resources are stored in a database accessible by the user, where resources may be tagged by hierarchy, bit widths, and library element types. Because the methods of the present invention are independent of the origin of the netlist for generating a resource estimate, the methods of the present invention provides flexibility when generating a resource estimate.

The pre-characterization may involve identifying parameter sets and their value ranges to create parameter vectors. For example, three parameters with two different values each results in $2^3$ or eight vectors. Implementation tools may be run for each vector to create a table of results. By repeating this for each netlist element, a library of estimation resources may be generated. These pre-characterization results may be stored in a number of different ways. The data may be stored in a table of raw data, or some other comparison technique such as curve fitting may be performed to reduce the amount of data that is stored. After the intermediate circuit modules are characterized, the estimation tool performs tasks to enable generating an estimate for a given netlist. That is, the pre-characterization results and netlist are read, where the estimation tool performs an individual estimation on each element in the netlist based upon its parameter set. As will be described in more detail below, the estimation tool may also perform various refinements and optimizations.

It should be noted that four different software tools, namely a user interface tool, a netlist-generation tool, an estimation tool, and a control/data characterization tool, may be used to implement the methods of the present invention. These tools may be independent of one another or may be combined. According to one embodiment, the user interface tool and the netlist-generation tool are incorporated in a common tool, whereas the estimation tool is a provided as a standalone tool. According to an alternate embodiment, all four tools are combined in a single, common tool. It is also important to note that there are some differences with ASICs and FPGAs. Targeting a standard cell library for an ASIC enables more degrees of freedom and therefore, it may be easier to estimate what the synthesis tool will do. Conversely, an FPGA contains an assortment of hard, heterogeneous hardware elements, providing a more difficult platform for estimation. Some specific examples of this include determining the threshold bit widths when a hard multiplier/DSP is used for arithmetic functions, or determining the threshold depth and bit width when a memory will be implemented in a Block-RAM. The size of the circuit design and the size of the target part may also be considered. For example, if BlockRAMs of a device may be used up, it still may be possible to use the device if LUT RAMs are used for certain memory requirements. One advantage of the methods of the present invention is that they provide a framework that may easily be adapted to changing synthesis tools, revisions and tool settings, as well as more easily integrated into new generations of devices. Such flexibility is significant for the short-term adoption of IP developers as well as long-term usage and effectiveness, allowing minimization of the upkeep and maintenance of the framework.

Accordingly, these library elements are pre-characterized with each element given a unique cost function. That is, each intermediate circuit module having a plurality of parameters sets may have one cost function for each kind of characteristic that is to be estimated (e.g. resources, area, power, throughput, latency, clock rate, etc.) and specific for the FPGA family targeted, based on such criteria as the number of inputs, the number of those inputs that are constants, the value of those constants, and the bit widths of inputs and output signals. When possible, the cost functions for the elements are expressed as empirical formulas with the above-mentioned input parameters as variables to make the estimation faster and extendable to an entire range of parameter values. Unlike conventional estimation tools which involve resource estimations of specific library elements that are instantiated into a given design, generating estimates based on elements that are inferred from a high level description of the circuit design allows a more dynamic estimation of the circuit design. Further, the methods of the present invention go beyond just estimating FPGA resources by providing estimates for dynamic characteristics of the circuit design. Additional information related to resource estimation may be found in U.S. patent application Ser. No. 12/041,167, filed on Mar. 3, 2008 by the assignee of the present application, the entire application of which is incorporated herein by reference.

Figure 5:
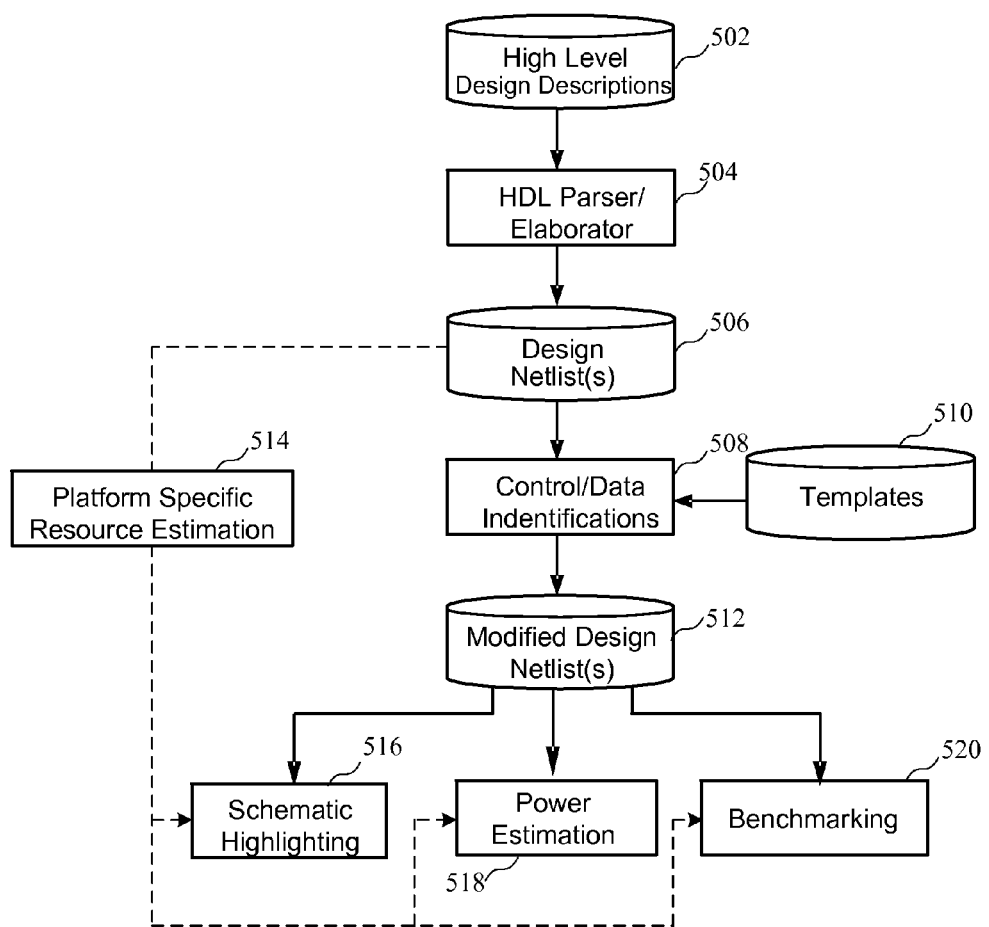
FIG. 5 is a flow diagram showing a method of implementing a circuit design using control and data path information according to an embodiment of the present invention.

Turning now to FIG. 5, a flow diagram shows a method of implementing a circuit design using control and data path information according to an embodiment of the present invention. In particular, designs of a high level design description block 502 are provided to an HDL parser/elaborator 504, which generates a representation of the circuit. By way of example, the HDL parser/elaborator 504 may generate corresponding design netlists 506. Control and data path identification is then performed at a step 508 using information from a templates block 510. As will be described in more detail below, the templates enable identifying control and data paths of the netlist. In particular, templates describe arrangements of elements of a known structure. These elements could be inputs, outputs, functional blocks, data widths, or a combination of elements which would indicate that a known structure. The known structure could be a macro, a combination of macros, or one or more macros and other elements. The templates could be based upon arrangements of elements, rules based upon signals, or a combination of elements and rules. A modified netlist 512 is then generated. For example, an annotated netlist may be generated, where the annotations indicate locations of data and control paths. While a netlist and annotated netlist are shown by way of example, it should be understood that other representations and modified representations could be generated, where the modified representation includes information related to control and data paths associated with the representation of the circuit.

The high level design descriptions are preferably represented in RTL (e.g., HDL such as VHDL, Verilog, System-Verilog) in order for an HDL parser/elaborator to be run on the designs. While it is not necessary to represent the designs in RTL, such a representation provides the required elaborated netlist to enable the methods of the present invention. A platform-independent netlist contains an interconnection of macros, which have been selected from a known library of operators and primitives (collectively called macros as set forth above). For each macro, the following information is known: macro type (e.g., adder, multiplexer, ROM), any specified parameters (e.g., bit widths, number of selections, memory depth), and any connections (e.g., use of constant inputs, driving and load macros).

The macros in the netlist are traversed and the information is compared to some pre-determined templates in order to perform control/data classifications. Some examples of these templates are set forth below. In particular, Finite-state machine (FSM) state registers are identified based on attributes in the netlist and tagged as "control" elements, where control elements control the routing of other signals, such as data signal routed in the network. An example of a control element of an FSM would be a register output net that has an "encoding states" attribute associated with it, listing all possible FSM states for this state register. The netlist is traversed, starting with the loads of these registers. Macros identified as elements in the FSM (e.g., muxes, registers, comparators) are tagged as "control," and loads of these macros are included in the traversal. Typically, only macros within the same logical hierarchy would be included as most FSMs are described in that manner. This process continues until all elements in this FSM are identified. Macro and net sets are then created and associated with the corresponding FSM state register.

Control signals from these FSMs are extended out to design boundaries, such as the chip I/Os, and control signals driving data processing paths are identified. Register controls (e.g., set/reset, clock enables) may also be included in the control set and extended out to chip inputs, including all generation logic. Each register in the netlist would then be checked for its control signals, and net and macro sets would be created. Operational "modes" of basic data processing templates (e.g., MACCs, counters) can also be included in the control set and extended to chip inputs. The operational modes would indicate the different control signals for the various modes of the data processing templates. All generation logic of these modes would be included in the control set.

Referring now to data paths, data paths can be identified by common data processing functionality (e.g., addition, multiplication) as well as word widths. All larger word widths would be identified as either data words or concatenated control buses based upon the above-mentioned control circuitry criteria. The threshold of what would be considered larger word widths would be dependent upon the application, if known, as well as the composition of the design. For example, if a video processing design is evaluated, it might be found that a majority of the composition of the design is 8-bit macros. Accordingly, an 8-bit word would be chosen as the threshold for data path identification.

As shown in FIG. 5, this control/data information is used to generate an internal, modified netlist database which can then be used for further design analysis. That is, in addition to any resource estimate which may be available, control and data information may be provided to enable a user to optimize a circuit. For example, a user may decide that a more efficient use of resources may be possible after viewing the configuration of control elements for a given circuit design. Methods of utilizing the resource estimates and control and data information are provided in more detail in reference to FIGS. 6-8.

FIG. 5 also shows the usage of the platform-specific resource estimation tool that can work in conjunction with these control/data identification techniques. Each macro of a netlist is tagged with a control or data identification as well as an association with a group. For example, a group could be a part of a specific FSM. Each macro in the annotated netlist that is tagged as either control or data is also associated with a relative estimated hardware cost from the resource estimation tool. Using these tools concurrently not only may help specify what elements comprise control and data elements, but also what hardware cost is associated with them. Comparative hardware costs can be explored at all levels of the design hierarchy using analysis of the annotated netlists, including the control overhead associated with all FSMs, register controls, and operational modes.

Various post-processing computations based upon the modified representation of the circuit may then be performed. According to one embodiment, schematic highlighting related to control and data paths may be performed, as shown in block 516. Schematic highlighting involves indicating the control and data paths associated with macros in a schematic to provide feedback to the user. After the framework in FIG. 5 is run on a given design, the annotated design netlist would be given to a schematic viewing tool to display control and data paths in a user interface. One straightforward visualization technique that could be used involves color coding for the control/data portions of the design. For example, control paths could be indicated in one color, and data paths could be indicated in a second color. Other color coded information could be provided based upon other criteria. If a concentration of control paths or data paths is particularly high in a certain area, those paths may have a different shade for example.

Another application that could utilize control and data information is the estimation of dynamic power in a design, as shown in block 518. The pre-characterization of various control structures (e.g., FSMs) and data paths with varying parameters (e.g., bit widths, processing types) could be used to refine the estimated toggle rates used in power estimation. This would provide a context for all hardware structures in the design, and could be used along with vectored or vectorless techniques to arrive at an estimate of toggle rate. Other power-related characteristics may also be affected by this analysis. For example, it may be found that control logic has typically lower toggle rates overall, higher glitch rates due to more random logic, and higher fan-out leading to more complex, multi-point routing. On the other hand, data paths may be found to have higher toggle rates but lower glitch rates, and simpler, point-to-point routing. The pipelining of the data paths as well as the bit widths could be incorporated to generate a refined and more accurate description of a power estimation for the circuit.

An additional application of control and data identification could be in device benchmarking. In additional to comparing a specific design in different devices, one particular application of benchmarking could be the development of hybrid FPGAs. A hybrid FPGA is an ASIC that contains both fine-grain (e.g., LUTs, flops) and coarse-grain (e.g., memories, DSP elements) programmable elements that have been specifically chosen based on a particular application domain. Floating point units (FPUs) could be extended to a whole range of coarse-grain hardware structures that are found to be common across a range of designs. Each design in a benchmark suite of designs is run through the framework in FIG. 1, and the control and data paths and macros are identified and extracted from each design. A comparison between the data structures are performed by first identifying an anchor macro (e.g., adder, multiplier) and traversing out from this macro. Commonality between structures in different designs are identified, assuming registers and multiplexers to be programmable options, and therefore, allowable variations in identified templates. The results of this analysis would be presented to the developer of the hybrid FPGA platform, enabling the developer to select the elements to incorporate in his customized FPGA. Platform specific resource estimations may be generated in block 514 based upon the design netlist as set forth in detail above. According to one embodiment of the invention, the platform specific resource estimations may be used in the post processing computations. For example, power estimation or device benchmarking could be based not only on control and data path information, but overall resource requirements.

Figure 6:
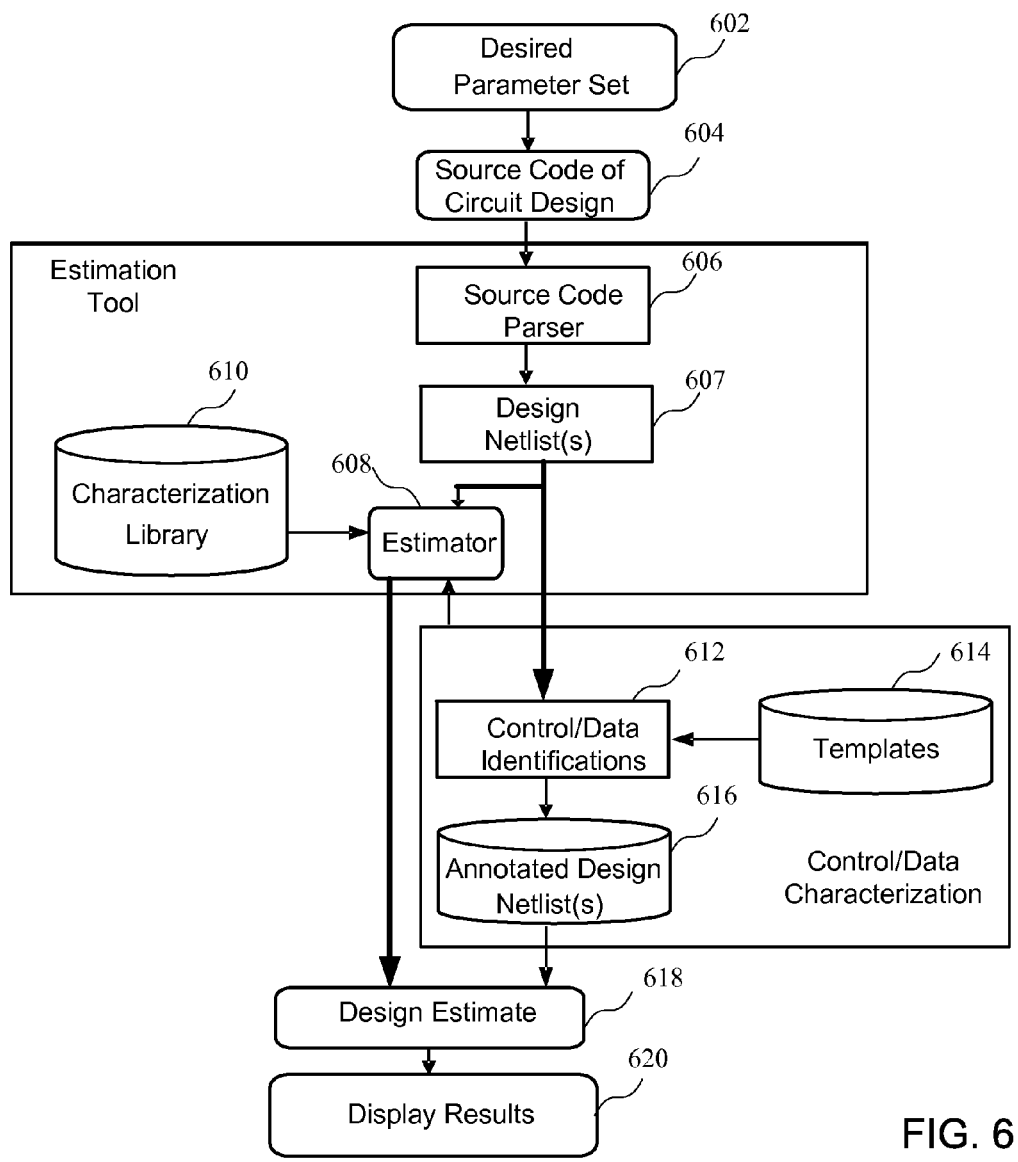
FIG. 6 is a flow diagram showing a method of generating a design estimate and providing control and data path information when implementing a circuit design according to an embodiment of the present invention.

Turning now to FIG. 6, a flow diagram shows a method of generating a design estimate and providing control and data path information when implementing a circuit design according to an embodiment of the present invention. As shown in FIG. 6, a desired parameter set is selected in block 602, and source code of a circuit design is provided to an estimation tool as shown in block 604. The estimation tool comprises a source code parser 606 such as a hardware description language (HDL) parser which inputs a parsed source code, such as a design netlist 607, to an estimator 608. The estimator also receives data from a characterization library 610. The characterization library may include raw data of a table or functions characterizing the data as set forth above. The estimator evaluates the intermediate circuit modules identified in the netlist generated by the HDL parser, and uses estimation data from the characterization library to generate the design estimate as set forth above. Control and data information may be provided to the estimator and used in the generation of estimates.

A control/data characterization tool also enables the generation of control and data information which may provide additional information to be displayed related to control and data paths. In particular, control/data identification block 612 enables, based upon templates 614, the generation of annotated design netlists 616.

The estimation tool generates a design estimate 618 and displays results 620. The control and data information may be used to generate the design estimate, and/or be used as a part of control and data information displayed with design information. The estimation tool and the control and characterization tool may be implemented using any general purpose computer, such as computer 302, and may be a part of another tool for enabling the implementation of a circuit design.

Figure 7:
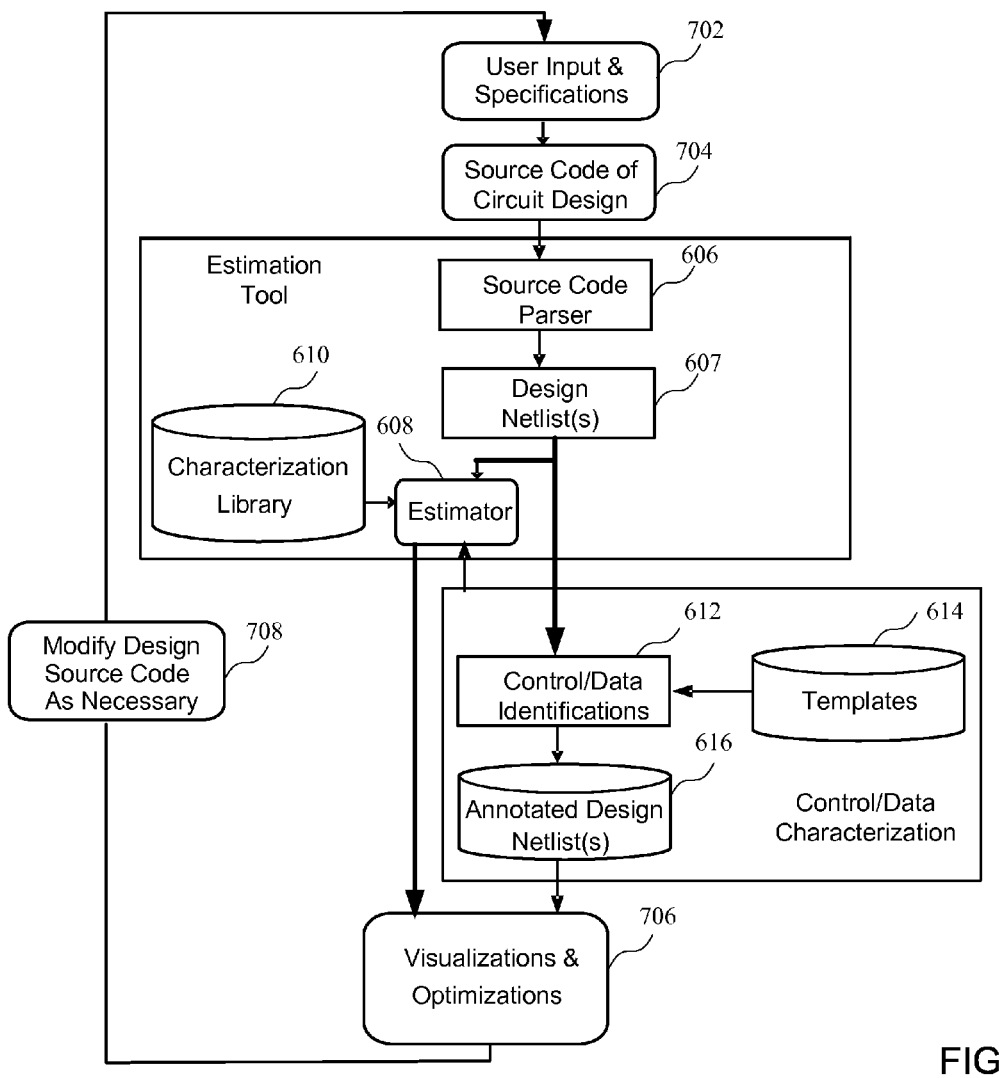
FIG. 7 is a flow diagram showing the display of a resource estimate and control and data path information for a circuit design according to an embodiment of the present invention.

Turning now to FIG. 7, a flow diagram shows the display of a resource estimate and control and data path information for a circuit design according to an embodiment of the present invention. As shown in the embodiment of FIG. 7, feedback is provided to a user to enable optimizations of a circuit design while the user is entering source code for the circuit design. In particular, after user inputs and specifications are selected as shown in block 702, source code of the circuit design is generated at a step 704 and provided to an estimation tool.

The estimation tool generates a design estimate with various visual feedbacks related to resource requirements and performance, as well as information related to the optimization of the circuit design, as shown in block 706. Information related to control and data characterization of the circuit design may also be implemented. The control/data characterization tool would generate the annotated design netlists 616 as described above. A user may be able to visualize the results generated by the estimation tool and the control and data characterization tool, and consider optimizations based upon the outputs. A user may then modify the source code as shown in block 708, where new user inputs may be further evaluated by the estimation tool. Control and data information may be provided to the estimator and used in the generation of estimates.

Figure 8:
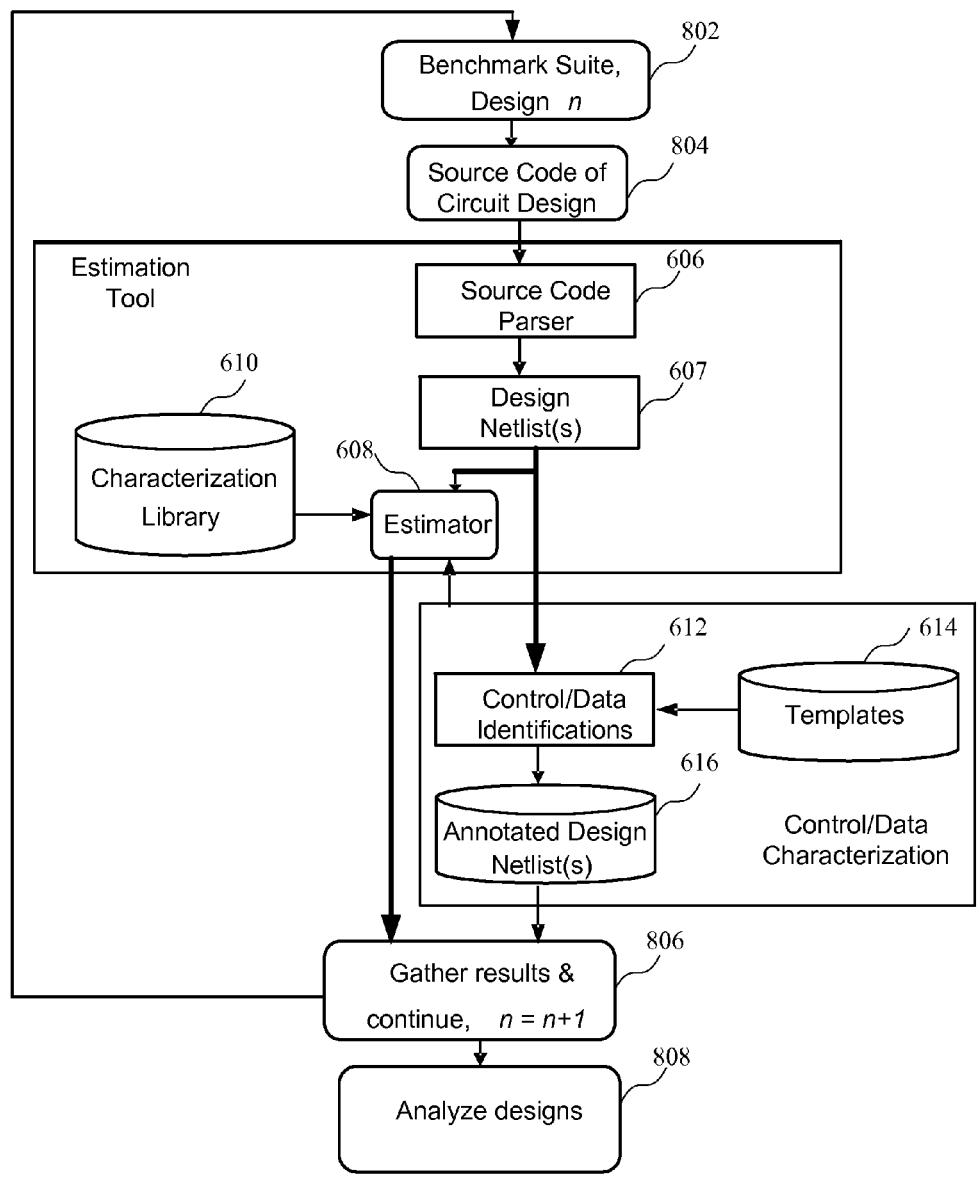
FIG. 8 is a flow diagram showing a method of benchmarking a circuit design based upon a plurality of parameter sets and control and data path information according to an embodiment of the present invention.

Turning now to FIG. 8, a flow diagram shows a method of benchmarking a circuit design based upon a plurality of parameter sets and control and data path information according to an embodiment of the present invention. According to the embodiment of FIG. 8, various circuit designs or a circuit design implemented according to a plurality of parameter sets enables a user to benchmark one or more circuit designs. In particular, a first design "n" of a benchmark suite of circuit designs is provided as shown in block 802. According to the embodiment of FIG. 8, the benchmark suite of designs may comprise a single design having a plurality of parameter sets, or a plurality of different designs. Source code of the design "n" is provided to an estimation tool as shown in block 804. The estimation tool generates a resource estimate, and the results are gathered at a step 806. Control and data path characterization is also performed, where the results are also gathered with the resource estimates at the step 806. The next design is then provided to the estimation tool at a step 806 until the resource estimates and the control and data path information for all of the designs have been generated, enabling the results to be analyzed as shown in block 808. The designs are analyzed based upon both the resource estimation as well as the control/data characterization. The benchmarking tool of FIG. 8 may be used in the development of hybrid FPGAs as set forth above.

Turning now to FIG. 9, a flow chart shows a method of implementing of a circuit design using control and data path information according to an embodiment of the present invention. Templates for control and data identification are specified at a step 902. A netlist for a circuit design is generated at a step 904. The netlist for the circuit design is analyzed at a step 906, and control and data path information is identified based upon paths and macros of the netlist and the templates at a step 908. An annotated netlist is generated based upon the control and data information at a step 910. It is then determined whether a particular post processing output is desired at a step 912. If so, the post processing output is provided at a step 914. While the method of FIG. 9 specifically refers to a netlist and a corresponding modified netlist, the method may be employed to provide any type of representation of the circuit and modified representation based upon control and data path information.

Turning now to FIG. 10, a flow chart shows a method of implementing a circuit design using control and data path information by identifying finite state machines according to an embodiment of the present invention. FSMs using state registers are identify as anchor macros in a netlist at a step 1002. The netlist is traversed to identify all FSM-based elements at a step 1004. Additional control signals in the design are identified by the traversal of the netlist to design boundaries at a step 1006. According to alternate embodiments, the FSM information can also be detected and passed on by the parser/elaborator.

Turning now to FIG. 11, a flow chart shows a method of implementing a circuit design using control and data path information by providing post-processing related to control and data information according to an embodiment of the present invention. The annotated netlist are provided to a schematic viewing tool at a step 1102. Control and data path information is identified at a step 1104. An output comprising results including the color coded layout is generated at a step 1106.

Turning now to FIG. 12, a flow chart shows a method of generating a power estimate based upon control and data path information according to an embodiment of the present invention. Estimated toggle rates based upon pre-characterization data are established at a step 1202. Estimated glitch rates based upon the pre-characterization data are established at a step 1204. A fanout based upon the pre-characterization data or netlist information is determined at a step 1206. Pipelining is implemented as necessary at a step 1208, and a power estimate is generated at a step 1210.

Figure 13:
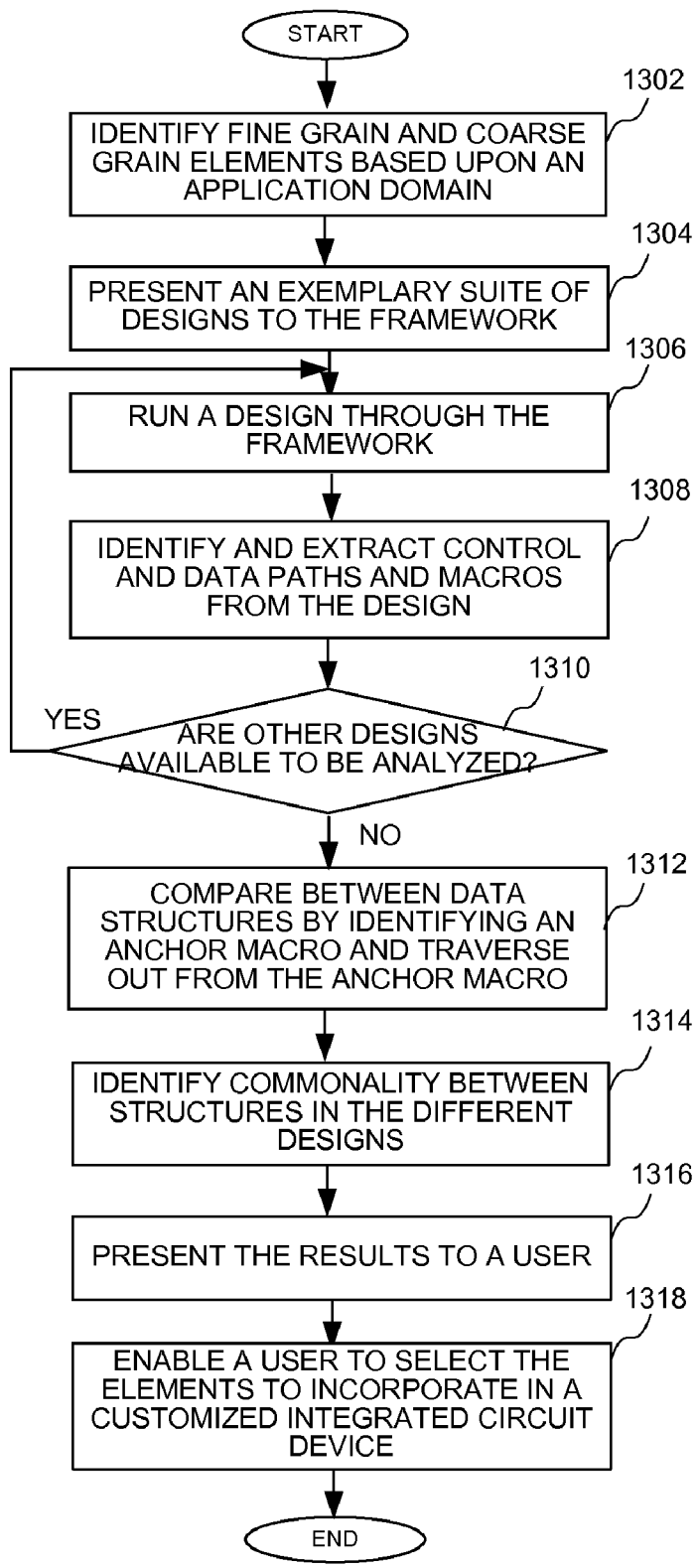
FIG. 13 is a flow chart showing a method of performing benchmarking according to an embodiment of the present invention.

Turning now to FIG. 13, a flow chart shows a method of performing benchmarking according to an embodiment of the present invention. Fine grain and coarse grain elements are identified based upon an application domain at a step 1302. An exemplary suite of designs is presented to the framework at a step 1304. A design is run through the framework at a step 1306. Control and data paths and macros are identified and extracted from the design at a step 1308. It is then determined whether other designs are available to be analyzed at a step 1310. A comparison between data structures is performed by identifying an anchor macro and traversing out form the macro at a step 1312. Commonality between structures in the different designs is identified at a step 1314. The results are present to a user at a step 1316. A user is enabled to select the elements to incorporate in a customized integrated circuit device at a step 1318.

Figure 14:
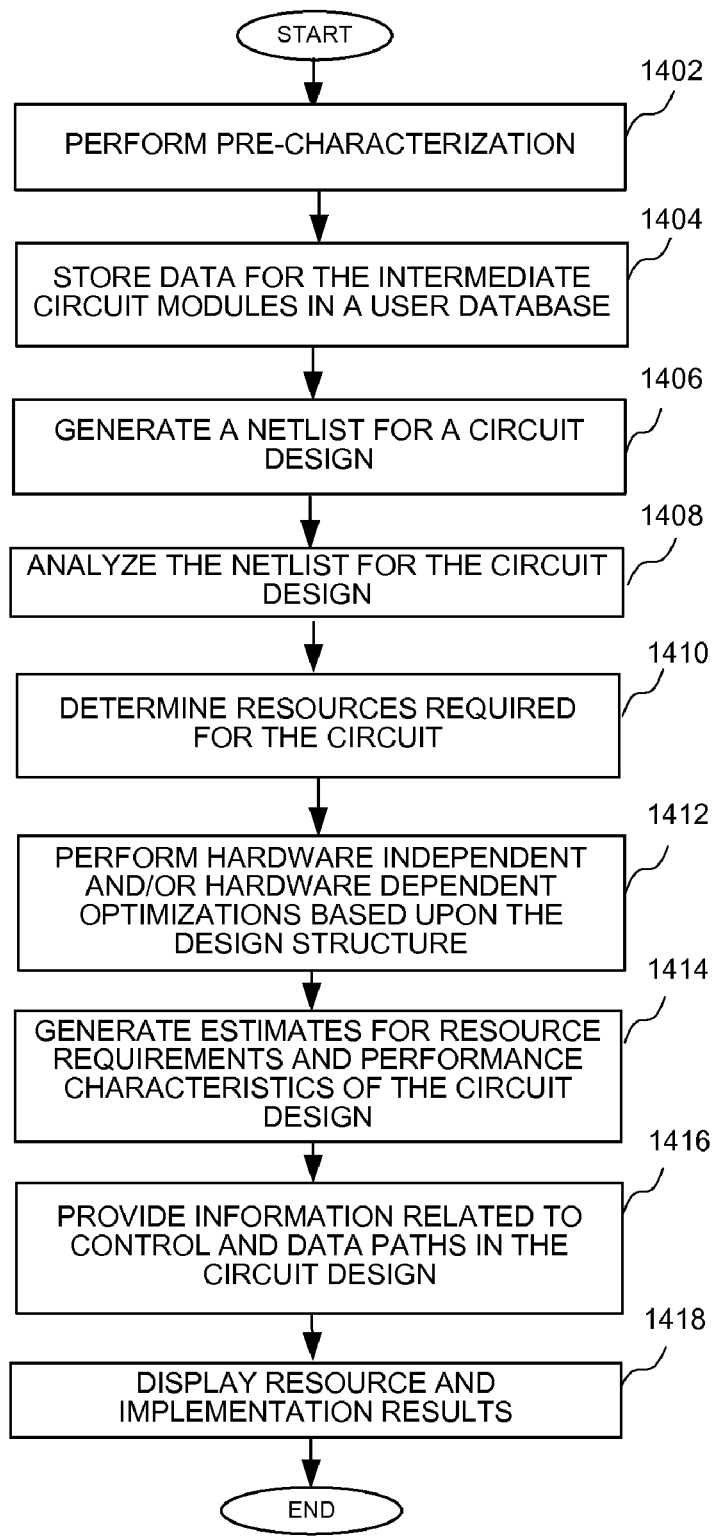
FIG. 14 is a flow chart showing a method of estimating resource requirements of a circuit design according to an embodiment of the present invention.

Turning now to FIG. 14, a flow chart shows a method of estimating resource requirements of a circuit design according to an embodiment of the present invention. A pre-characterization of intermediate circuit modules is performed at a step 1402. The pre-characterization may be performed according to any of the embodiments set forth above. Data for the intermediate circuit modules is stored in a user database at a step 1404. The data may be a table of raw data or equations generated as a result of a regression analysis, such as curve fitting. A netlist for a circuit design is then generated at a step 1406, and analyzed at a step at a step 1408. Resources required to implement the circuit design are determined at a step 1410. Hardware independent and/or hardware dependent optimizations are performed based upon the structure of the design at a step 1412. That is, based upon the design structure of the circuit design in the netlist, as well as the resources of the target device, some optimizations may be made to more accurately estimate the intermediate circuit modules of the netlist which are actually required. While some mapping may be required to implement the optimizations, the estimations of resources for the circuit design may be more accurate. An estimation of the resource requirements and a performance characterization of the circuit design are then generated at a step 1414. It should be noted that steps 1410-1414 could be performed separately, or in one-loop iteration. For example, after the estimator identifies a multiplier, the context of the design structure could also be examined to determine if the multiplier is a part of a MACC, and if so, consume the adder, muxes and registers also. Information related to the control and data paths in the circuit design is provided at a step 1416. The results are then displayed at a step 1418. For example, the resource estimates could be cross-referenced to the line(s) of source code and highlighted with the code. According to one embodiment of the invention, the estimation of resource requirements may be stored in a hierarchical database. Therefore, portions of the design may be modified, and new estimates based upon those portions of the design may be stored. For larger designs, this implementation would reduce the time required to generate an estimate because a new estimate would be generated only for a portion of a design.

Figure 15:
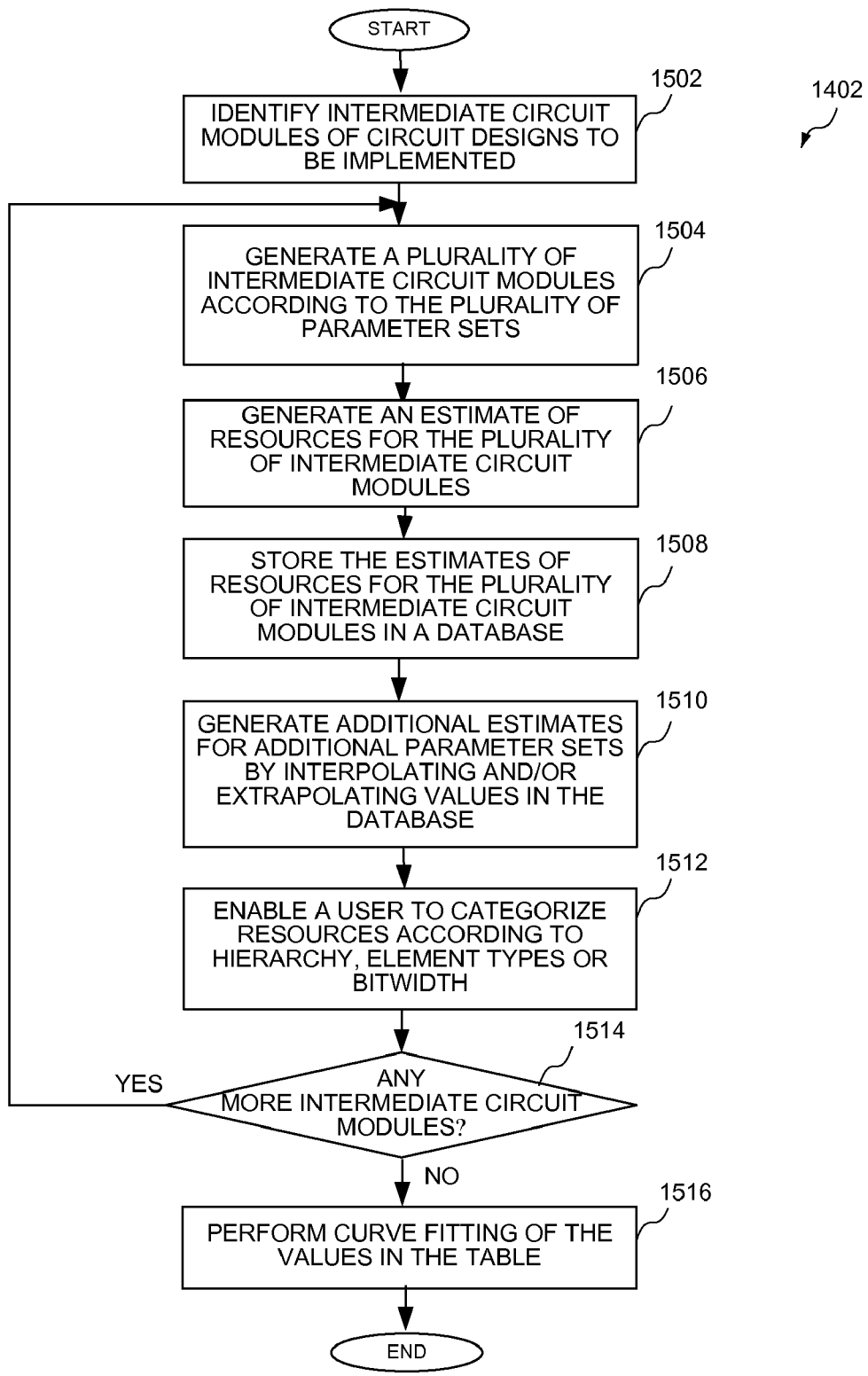
FIG. 15 is a flow chart showing a method of generating data used by an estimation tool for estimating resource requirements of a circuit design according to an embodiment of the present invention.

Turning now to FIG. 15, a flow chart shows a method of generating data used by an estimation tool for estimating resource requirements of a circuit design according to an embodiment of the present invention. Intermediate circuit modules of circuit designs to be implemented are identified at a step 1502. A plurality of intermediate circuit modules is characterized according to a plurality of parameter sets at a step 1504. An estimate of resources for the plurality of intermediated circuit module for each of the parameter sets is generated at a step 1506, and stored in a database at a step 1508. Additional estimates may be generated for additional parameter sets by interpolating and/or extrapolating values in the database at a step 1510. A user may then categorize the resources according to hierarchy, element types or bit width at a step 1512. It is then determined if there are any more intermediate circuit modules for which characterization data should be generated at a step 1514. If not, curve fitting of the values in the table is performed at a step 1516.

The methods set forth in the flow charts of FIGS. 9-15 may be implemented using any of the circuits of FIGS. 1-8 as described above, or other suitable circuits. It should be noted that information related to the design is fed back to the user in a simple, easy-to-read fashion, and tied to the hierarchy of the design for easier deciphering by the user. The methods set forth above provide immediate feedback to the user regarding source code and synthesis settings, and allows for a comparison of device families and architectures, as well as design space exploration (DSE). DSE involves modifying the settings of the synthesis tools based on the estimated resources of the circuit design. Because a single HLL description of a circuit design may be synthesized to multiple different hardware implementations, estimating implementation properties is important in the analysis of a circuit design. That is, in order to do the resource estimation properly, it must have intimate knowledge of the down-chain tool settings.

According to one embodiment, the computer 302 may comprise a non-transitory computer-readable storage medium comprising computer-executable code for implementing a circuit design. For example, the computer-executable code may comprise code for specifying criteria for control and data path identification; code for generating a representation for the circuit design; code for analyzing the representation based upon the criteria for control and data path identification; code for identifying control and data elements of the circuit design based upon paths and macros of the circuit design; and code for generating, by a computer, a modified representation for the circuit design based upon the identified control and data elements.

The code for identifying control and data elements of the circuit design based upon paths and macros of the circuit design comprises code for identifying control and data elements of the circuit design based upon templates. The computer-readable storage medium may further comprise code for generating characteristic data related to the circuit design, wherein the code for generating characteristic data comprises code for generating at least one of a highlighted schematic based upon the modified representation, a power estimate based upon the modified representation, and a benchmark of the circuit design based upon the modified representation.

The computer-readable storage medium may further comprise code for generating a resource estimation associated with the circuit design, wherein the code for generating characteristic data related to the circuit design may comprise code for generating characteristic data based upon the resource estimation. The code for generating a representation for a circuit design may comprise code for generating a netlist for the circuit design, and the code for generating a modified representation for the circuit design may comprise code for generating an annotated netlist. Other code may be generated to implement other aspects of the methods as described above.

The methods of the present invention also provide a user with resource estimates and information related to control and data paths early in the design process. Further, the methods enable immediate feedback to a user to allow for source code evaluation and optimizations without performing a full place and route to target a device. The information may also be provided to the user in a hierarchical fashion so that optimizations may be pinpointed to specific high-level language constructs in the source code. The resource estimates are also made available during high-level synthesis so that the design may be made to fit into the desired FPGA.

According to another embodiment, the resource estimation and control and data path information is performed as a background task, either on the user's computer, a networked cluster of computers, or any combination of computer resources as is well known in the art. Given a known set of synthesis parameters, the estimation procedure could be either initiated by the user selecting a menu option or automatically performed as a background task as the user is editing the source code for the circuit design. The most recent estimated statistics may be displayed to the user directly on a graphical user interface (GUI) as the source code is being edited. The feedback may comprise a red light/green light indication or a numerical indication to provide "on-the-fly" feedback as the source code is entered. Since there is an established correlation between the estimates and the HLL constructs, "hot spots" may be highlighted in the editor and pinpointed for the user to help optimize the design. The user may also decide to interact with the database of resources and display the resources in a desired fashion. As described above, exemplary categories that may be used by the user to view the database could include but are not limited to element types, bit widths, and hierarchy.

A database is created by the netlist-generation tool that maps language constructs of the source code to elements in the netlist. This database may contain file names and line number(s) in the source code, hierarchy information if it is a shared resource, or combinations thereof. The database above is supplemented by a second database created by an estimation tool which maps the elements in the netlist to estimated hardware resources and characteristics. This may include one-to-many mappings for shared resources. These two databases are used by the user interface tool to provide linkage of language constructs to estimated hardware.

According to one embodiment, direct links between source code and hardware resources are displayed on a GUI. Common formats such as tables and graphs may also be used. These databases may be updated by either a user request or automatically in the background on a host machine. These updates may be done on an incremental basis. That is, if the user is only editing one part of the code, then only that portion is sent to the estimation tool. This would be particularly important if run in background mode. The estimation information may be in the form of a searchable database, where the user may request that the information be categorized by such things as bit width, element types/categories (e.g., arithmetic elements, muxes, memories), hierarchy, or any combination thereof. The user interface tool may highlight hot spots in the design automatically based upon user selected thresholds. The user preferably may also be able to select these thresholds. Based on these hot spots, the user may make requests to a netlist-generation tool to consider different implementations for that hardware.

It can therefore be appreciated that the new and novel method of implementing a circuit design using control and data path information has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. A method of implementing a circuit design, the method comprising:
 specifying criteria for control and data path identification;
 generating a representation for the circuit design;
 analyzing the representation based upon the criteria for control and data path identification;
 identifying control and data elements of the circuit design based upon paths and macros of the circuit design;
 generating, by a computer, a modified representation for the circuit design based upon the identified control and data elements;
 generating a resource estimation associated with the circuit design; and
 generating characteristic data related to the circuit design, wherein generating characteristic data related to the circuit design comprises generating characteristic data based upon the resource estimation.

2. The method of claim 1 wherein identifying control and data elements of the circuit design based upon paths and macros of the circuit design comprises identifying control and data elements of the circuit design based upon templates.

3. The method of claim 1 wherein generating characteristic data comprises at least one of generating a highlighted schematic based upon the modified representation, generating a power estimate based upon the modified representation, and benchmarking the circuit design based upon the modified representation.

4. The method of claim 1 wherein generating a representation for a circuit design comprises generating a netlist for the circuit design.

5. The method of claim 4 wherein generating a modified representation for the circuit design comprises generating an annotated netlist.

6. A method of implementing a circuit design, the method comprising:
 specifying criteria for control and data identification;
 generating a representation for the circuit design by generating a netlist for the circuit design;
 analyzing the representation based upon the criteria for control and data path identification;
 identifying finite state machines using state registers as anchor macros in the representation;
 traversing elements associated with the finite state machines; and
 generating, by a computer, a modified representation for the circuit design based upon the elements associated with the finite state machines by generating an annotated netlist.

7. The method of claim 6 wherein traversing elements associated with the finite state machines comprises identifying a state register and traversing the representation for the circuit design with respect to the state register.

8. The method of claim 6 further comprising designating the elements associated with finite state machines as control elements.

9. The method of claim 6 further comprising identifying control signals extending out to boundaries of the circuit design.

10. The method of claim 6 further comprising including operational modes of basic data processing templates in a control set.

11. The method of claim 6 further comprising identifying data paths of the circuit design by common data processing functionality and widths of data words.

12. A non-transitory computer-readable storage medium comprising computer-executable code for implementing a circuit design, the computer-executable code comprising:
 code for specifying criteria for control and data path identification;
 code for generating a representation for the circuit design;
 code for analyzing the representation based upon the criteria for control and data path identification;
 code for identifying control and data elements of the circuit design based upon paths and macros of the circuit design;
 code for generating a modified representation for the circuit design based upon the identified control and data elements;
 code for generating a resource estimation associated with the circuit design; and
 code for generating characteristic data related to the circuit design, wherein the code for generating characteristic data related to the circuit design comprises code for generating characteristic data based upon the resource estimation.

13. The computer-readable storage medium of claim 12 wherein the code for identifying control and data elements of the circuit design based upon paths and macros of the circuit design comprises code for identifying control and data elements of the circuit design based upon templates.

14. The computer-readable storage medium of claim 12 wherein the code for generating characteristic data comprises code for generating at least one of a highlighted schematic based upon the modified representation, a power estimate based upon the modified representation, and a benchmark of the circuit design based upon the modified representation.

15. The computer-readable storage medium of claim 12 wherein the code for generating a representation for a circuit design comprises code for generating a netlist for the circuit design, and wherein the code for generating a modified representation for the circuit design comprises code for generating an annotated netlist.

\* \* \* \* \*